(12) United States Patent
Liu

(10) Patent No.: US 9,647,040 B2
(45) Date of Patent: May 9, 2017

(54) TOUCH DISPLAY DEVICE AND MANUFACTURING METHOD THEREOF

(75) Inventor: Chen-Yu Liu, Jhongli (TW)

(73) Assignee: TPK TOUCH SOLUTIONS INC., Taipei (TW)

(*) Notice: Subject to any disclaimer, the term of this patent is extended or adjusted under 35 U.S.C. 154(b) by 692 days.

(21) Appl. No.: 13/419,390

(22) Filed: Mar. 13, 2012

(65) Prior Publication Data
US 2013/0026501 A1  Jan. 31, 2013

(30) Foreign Application Priority Data
Jul. 28, 2011  (TW) .............. 100126713 A

(51) Int. Cl.
*H01L 51/50* (2006.01)
*H01L 51/52* (2006.01)
*H01L 27/32* (2006.01)
*G06F 3/041* (2006.01)
(Continued)

(52) U.S. Cl.
CPC ............ *H01L 27/323* (2013.01); *G06F 3/044* (2013.01); *G06F 3/0412* (2013.01); *H01L 27/3251* (2013.01); *G06F 2203/04103* (2013.01)

(58) Field of Classification Search
CPC ......... H01L 51/52; H01L 51/56; H01L 27/32; H01L 27/3225; H01L 27/3227; H01L 27/3251; H01L 27/3253; H01L 27/3276; H01L 27/3286; H01L 27/3288; H01L 27/3297; H01L 51/00; H01L 51/5203; H01L 51/5253; H01L 51/5246; H01L 27/3202; H01L 27/3204; H01L 27/323; H01L 27/3234; H01J 1/63; G06F 3/0412; G06F 3/044; G06F 3/045; G06F 3/0488; (Continued)

(56) References Cited

U.S. PATENT DOCUMENTS 7,498,186 B2 * 3/2009 Lee .................................. 438/28
2003/0234769 A1 * 12/2003 Cross et al. ................... 345/173
2007/0242055 A1 10/2007 Lai
(Continued)

FOREIGN PATENT DOCUMENTS

CN       1652651       8/2005
CN       1664852       9/2005
(Continued)

OTHER PUBLICATIONS

Hu, OLED display screen with touch function, 2009, machine translation of CN 201562417, pp. 1-3.*

*Primary Examiner* — Natalia Gondarenko
(74) *Attorney, Agent, or Firm* — Cooper Legal Group, LLC

(57) ABSTRACT

The present invention discloses a touch display device and a manufacturing method thereof, the display device comprising: an OLED display layer disposed on a lower substrate; an upper substrate; an air layer formed between the upper substrate and the lower substrate; and a touch module, disposed above the OLED display layer, wherein the touch module comprises: a first sensing circuit layer and a second sensing circuit layer, further wherein the first sensing circuit layer and the second sensing circuit layer are spaced and the distance between them is more than 2 μm. The display device can reduce interference in detection circuit caused by coupling capacitance formed between the sensing circuit layers thereby improving accuracy of touch detection.

17 Claims, 4 Drawing Sheets

(51) Int. Cl.
*G06F 3/044* (2006.01)
*H01L 51/56* (2006.01)

(58) Field of Classification Search
CPC ........... G06F 19/00; G06F 2203/04103; G06F 2203/04803; G01L 1/14
USPC ........... 257/88, 40, 72, E51.018; 438/34, 26; 313/504; 345/174, 173, 179
See application file for complete search history.

(56) References Cited

U.S. PATENT DOCUMENTS

| | | | |
|---|---|---|---|
| 2008/0211395 A1* | 9/2008 | Koshihara ............... G06F 3/044 313/504 |
| 2009/0053963 A1* | 2/2009 | Takahashi et al. ............. 445/24 |
| 2009/0084613 A1 | 4/2009 | Yang et al. |
| 2009/0195152 A1* | 8/2009 | Sawano ........................ 313/504 |
| 2009/0284487 A1 | 11/2009 | Nakanishi et al. |
| 2010/0231126 A1* | 9/2010 | Choi ............................. 313/504 |
| 2010/0258346 A1* | 10/2010 | Chen et al. .................... 174/521 |
| 2010/0265206 A1* | 10/2010 | Chen .............................. 345/174 |
| 2010/0277425 A1* | 11/2010 | Choi ..................... G06F 3/0412 345/173 |
| 2010/0323157 A1* | 12/2010 | Lin .......................... G02B 5/02 428/141 |
| 2011/0096025 A1* | 4/2011 | Slobodin et al. ............. 345/174 |
| 2011/0115727 A1 | 5/2011 | Feng et al. |
| 2011/0278078 A1* | 11/2011 | Schediwy ............... G01L 1/146 178/18.06 |

FOREIGN PATENT DOCUMENTS

| | | |
|---|---|---|
| CN | 201562417 U | 8/2010 |
| TW | I267014 | 11/2006 |
| TW | I317086 | 11/2009 |
| TW | 201039304 | 11/2010 |
| TW | 201039304 A1 | 11/2010 |
| TW | 201106231 | 2/2011 |
| WO | 2010032329 | 3/2010 |

\* cited by examiner (PRIOR ATR)

TOUCH DISPLAY DEVICE AND MANUFACTURING METHOD THEREOF

This application claims the benefit of Taiwan application No. 100126713, filed on Jul. 28, 2011.

FIELD OF THE INVENTION

The present disclosure relates to a touch display device and a manufacturing method thereof, and more particularly relates to an OLED touch display device and a manufacturing method thereof.

BACKGROUND OF THE INVENTION

At present, human-machine interface technologies are developing rapidly, among which OLED display, as a new type of display, is favored by many people due to its advantages of self-luminous panel, high brightness, high reaction speed, and low power consumption, and is widely used with good prospect at present.

Besides, as a new type of input device, touch screen is replacing keyboard, mouse and other traditional input devices gradually due to the advantages that it is lighter, thinner and more humanised. Touch screen users can conduct input operation while browsing contents displayed on the screen, which makes human-machine communication very convenient and accurate. Therefore, touch screens are widely used in PDAs, mobile phones, GPS and other portable electronic products.

In view of many advantages of OLED and touch device, more and more attention is paid to the development of OLED display with an integrated touch function. FIG. 1 shows a conventional OLED touch display 1. The touch display 1 comprises an upper substrate 11, a lower substrate 12, a capacitive touch module 13 between them, an OLED display module 14, and a sealing glue layer 15. The upper substrate 11 comprises an upper surface 111 used for touch and a lower surface 112 encapsulated inside the display. The capacitive touch module 13 is configured on the lower surface 112 of the upper substrate 11 and comprises a first conducting layer 131, a second conducting layer 133, and an insulating layer 132 between the two. The OLED display module 14 is disposed on the inner surface 121 of the lower substrate 12, while the external surface 122 is exposed outside the display. The OLED display structure 14 comprises a hole injection layer 141, an organic emitting layer 142, and an electron injection layer 143. Integrating the touch module 13 into the OLED display 14 can effectively reduce thickness of the display 1.

However, there is only one insulating layer 132 between the first conducting layer 131 and the second conducting layer 133 of the touch module 13, thickness of which is less than 2 μm in general and therefore, comparatively, large coupling capacitance will be generated between the first conducting layer 131, and the second conducting layer 133 due to close distance. In practical detection, besides finger touch, capacitance exists between a finger and a panel. Other background capacitances take place between two electrode layers or between electrodes and surrounding environment. Larger the background capacitance is, larger the interference in signal detection will be. Large coupling capacitance generated between the first conducting layer 131 and the second conducting layer 133 constitutes the component of the background capacitance and therefore, the coupling capacitance will affect the accuracy for detection of capacitance touch location.

SUMMARY OF THE INVENTION

The present invention provides a touch display device and a manufacturing method thereof with higher touch detection accuracy.

According to the present disclosure, a touch display comprises:
an OLED display layer disposed on a lower substrate;
an upper substrate;
an air layer formed between the upper substrate and the lower substrate; and
a touch module, disposed above the OLED display layer, wherein the touch module comprises: a first sensing circuit layer and a second sensing circuit layer, the first sensing circuit layer and the second sensing circuit layer being spaced and the distance between them is more than 2 μm.

In one embodiment, the air layer is between the first sensing circuit layer and the second sensing circuit layer, and the upper substrate comprises a first surface away from the OLED display layer, and a second surface on which the first sensing circuit layer is disposed, wherein the second surface is, close to the OLED display layer, further wherein the second sensing circuit layer is disposed above the OLED display layer.

In one embodiment, the touch display device further comprises a protection layer, wherein the protection layer covers the OLED display layer and the second sensing circuit layer is disposed on the protection layer.

In one embodiment, the first sensing circuit layer and the second sensing circuit layer are disposed opposite to each other and thickness of the air layer between them ranges from 5 μm to 100 μm.

In one embodiment, the touch display further comprises a sealing glue layer, formed between the upper substrate and the lower substrate, wherein the OLED display layer and the touch module are encapsulated inside the space formed by the upper substrate, the lower substrate and the sealing glue layer.

In one embodiment, the air layer and the upper substrate are between the first sensing circuit layer and the second sensing circuit layer, wherein the upper substrate comprises a first surface on which the first sensing circuit layer is disposed away from the OLED display layer, and a second surface, close to the OLED display layer, wherein the second sensing circuit layer is disposed above the OLED display layer.

In one embodiment, the touch display device further comprises a protection layer, wherein the protection layer covers the OLED display layer, and the second sensing circuit layer is disposed on the protection layer.

In one embodiment, the touch display further comprises a sealing glue layer, formed between the upper substrate and the lower substrate, wherein the OLED display layer and the second sensing circuit layer are encapsulated inside the space formed by the upper substrate, the lower substrate and the sealing glue layer.

In one embodiment, wherein the upper substrate is between the first sensing circuit layer and the second sensing circuit layer, wherein the upper substrate comprises a first surface and a second surface, further wherein the first sensing circuit layer is disposed on the second surface and the second sensing circuit layer is disposed on the first surface.

In one embodiment, the first sensing circuit layer is a first pattern conducting layer comprising a plurality of first touch electrode serials extended along a first direction, each of first touch electrode serials comprising a plurality of electrically connected first touch electrodes, further wherein the second sensing circuit layer is a second pattern conducting layer comprising a plurality of second touch electrode serials extended along a second direction, each of the second touch electrode serials comprising a plurality of electrically connected second touch electrodes; further wherein the first direction and the second direction are different.

In one embodiment, the first pattern conducting layer and the second pattern conducting layer are transparent conducting layers.

In one embodiment, an OLED display layer comprises:

an active element array disposed on the lower substrate; and an organic light-emitting layer disposed on the active element array, wherein the organic light-emitting layer comprises an counter electrode, a pixel electrode, and an intermediate layer between them.

In one embodiment, the protection layer is made of an insulation material.

According to the present disclosure, a manufacturing method for a touch display device, comprises:

disposing an OLED display layer on a lower substrate, wherein the lower substrate is configured opposite to an upper substrate with an air layer between the upper substrate and the lower substrate; and forming a touch module above the OLED display layer, wherein the touch module comprises a first sensing circuit layer and a second sensing circuit layer, further wherein the first sensing circuit layer and the second sensing circuit layer are spaced and the distance between them is more than 2 μm.

In one embodiment, the air layer is between the first sensing circuit layer and the second sensing circuit layer, and the upper substrate comprises a first surface away from the OLED display layer and a second surface, on which the first sensing circuit layer is disposed, wherein the second surface is close to the OLED display layer, further wherein the second sensing circuit layer is disposed above the OLED display layer.

In one embodiment, the touch display device further comprises a protection layer covering the OLED display layer, wherein the second sensing circuit layer is disposed on the protection layer.

In one embodiment, the first sensing circuit layer and the second sensing circuit layer are disposed opposite to each other and the thickness of the air layer between them is 5 μm~100 μm.

In one embodiment, the touch display device further comprises forming a sealing glue layer to glue the upper substrate and the lower substrate together, wherein the OLED display layer and the touch module are encapsulated inside the space formed by the upper substrate, the lower substrate and the sealing glue layer.

In one embodiment, the air layer and the upper substrate are between the first sensing circuit layer and the second sensing circuit layer, wherein the upper substrate comprises a first surface, on which the first sensing circuit layer is disposed away from the OLED display layer, and a second surface close to the OLED display layer, wherein the second sensing circuit layer is disposed above the OLED display layer.

In one embodiment, the touch display device further comprises a protection layer covering the OLED display layer, wherein the second sensing circuit layer is disposed on the protection layer.

In one embodiment, the touch display device further comprises forming a sealing glue layer to glue the upper substrate and the lower substrate together, wherein the OLED display layer and the second sensing circuit layer are encapsulated inside the space formed by the upper substrate, the lower substrate and the sealing glue layer.

In one embodiment, the upper substrate is between the first sensing circuit layer and the second sensing circuit layer, wherein the upper substrate comprises a first surface and a second surface, further wherein the first sensing circuit layer is disposed on the second surface and the second sensing circuit layer is disposed on the first surface.

In one embodiment, method of forming an OLED display layer comprises:

disposing an active element array on the lower substrate; and disposing an organic light-emitting layer on the active element array, wherein the organic light-emitting layer comprises an counter electrode, a pixel electrode, and an intermediate layer.

In an embodiment, distance between the first sensing circuit layer and the second sensing circuit layer of the touch display device is more than thickness of the insulating layer itself, and therefore interference in touch detection caused by coupling capacitance generated between the two sensing circuit layers can be significantly reduced to improve accuracy of touch detection.

DETAILED DESCRIPTION OF THE EMBODIMENTS

In accordance with the usual meaning of "a" and "the" in patents, reference, for example, to "an" electrode or "the" electrode is inclusive of one or more electrodes. In this application, the use of the singular includes the plural and vice versa unless specifically stated otherwise, for example, the term "active element array" includes singular and plural forms. The section headings used herein are for organizational purposes only, and are not to be construed as limiting the subject matter described.

The detailed description of the present invention will be discussed in the following embodiments, which are not intended to limit the scope of the present invention, but still can be adapted for other applications. While drawings are illustrated in details, it is appreciated that the quantity of the disclosed components could be greater or less than disclosed, except those components with express restricting amount.

The First Embodiment

Figure 1:
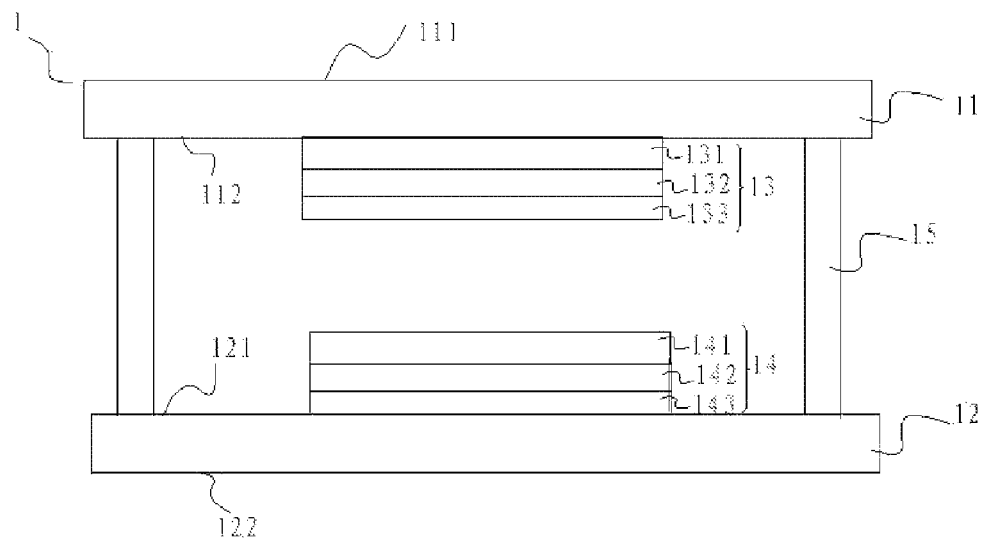
FIG. 1 is a schematic view of a conventional OLED touch display.
Figure 2:
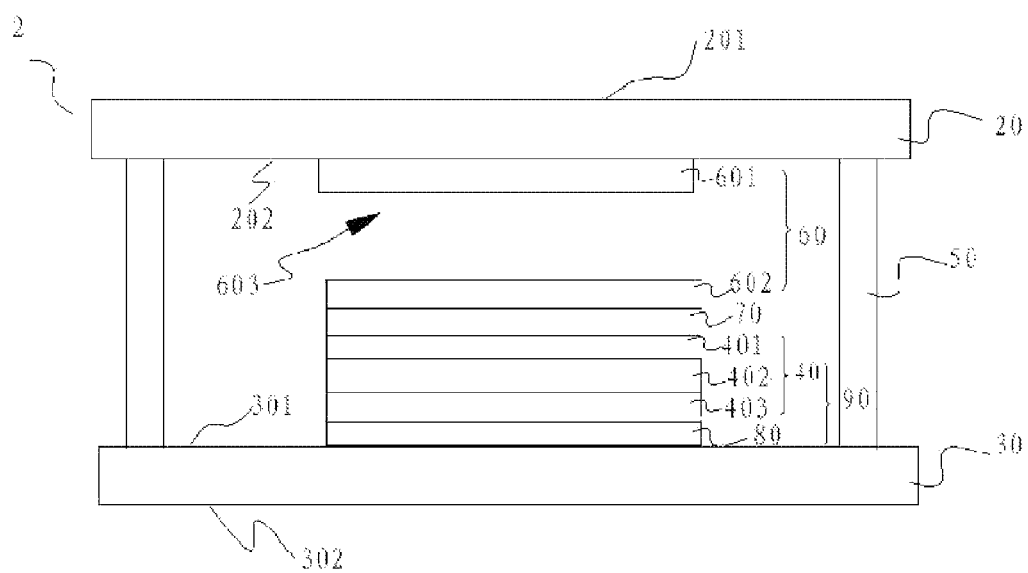
FIG. 2 is a schematic view of a touch display device in accordance with the first embodiment of the present invention.

FIG. 2 is a schematic view of a touch display device in accordance with the first embodiment of the present invention. As shown in FIG. 2, a touch display device 2 in the present embodiment comprises an OLED display layer 90 disposed on a lower substrate 30; an upper substrate 20; an air layer 603 formed between the upper substrate 20 and the lower substrate 30; and a touch module 60 formed by a first sensing circuit layer 601 and a second sensing circuit layer 602, wherein the first sensing circuit layer and the second sensing circuit layer being spaced and the distance between them is more than 2 μm.

The upper substrate 20 and the lower substrate 30 can be made of transparent materials, such as solid glass substrates and flexible plastic substrate. The upper substrate 20 comprises a first surface 201 away from the OLED display layer 90 and a second surface 202 close to the OLED display layer 90, wherein the first sensing circuit layer 601 is disposed on the second surface 202 of the upper substrate 20 while the first surface 201 of the upper substrate 20 is only used for touching by the users. The lower substrate 30 and the upper substrate 20 are disposed opposite to each other. The lower substrate 30 comprises a first surface 301 close to the OLED display layer 90 and a second surface 302 away from the OLED display layer 90; the first surface 301 of the lower substrate 20 faces to the second surface 202 of the upper substrate while the other external surface 302 belongs to external surface of the touch display device body, wherein the OLED display layer 90 is disposed on the lower substrate 30 and particularly disposed on the first surface 301 of the lower substrate 30, and the second sensing circuit layer 602 is disposed above the OLED display layer 90 and is disposed opposite to the first sensing circuit layer 601.

Furthermore, the touch display device 2 can also comprise a protection layer 70 covering a surface of the OLED display layer 90, wherein the second sensing circuit layer 602 can be further disposed on a surface of the protection layer 70.

Figure 3:
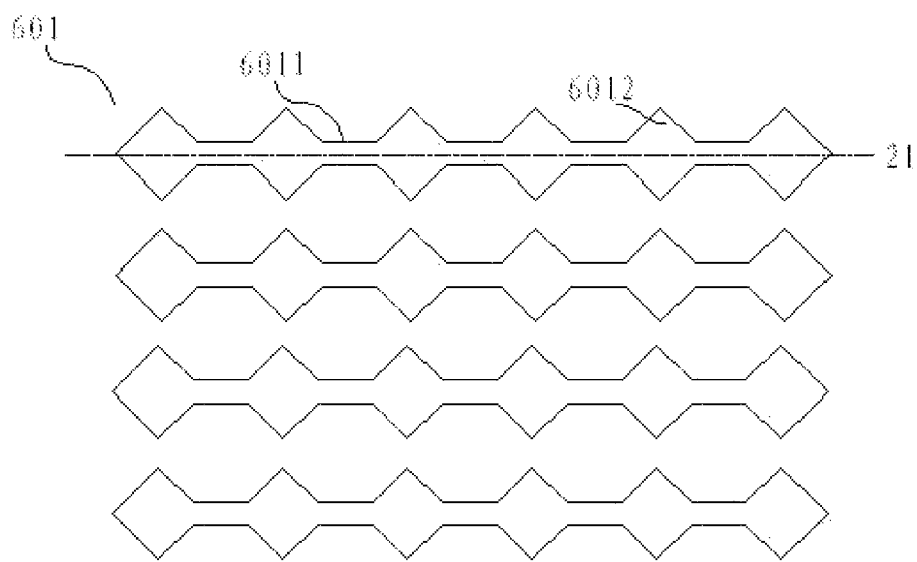
FIG. 3 is a schematic view of a first sensing circuit layer pattern.

FIG. 3 is a schematic view of a first sensing circuit layer pattern. As shown in FIG. 3, the first sensing circuit layer 601 is a first pattern conducting layer comprising a plurality of first touch electrode serials 6011 extended along a first direction 21, and each first touch electrode serial 6011 comprises a plurality of electrically connected first touch electrodes 6012. The first sensing circuit layer 601 can be a transparent conducting layer, wherein material of the transparent conducting layer can be selected from Indium Zinc Oxide, Gallium-doped Zinc Oxide, Aluminum-doped Zinc Oxide, Fluorine Tin Oxide, Antimony-doped Tin Oxide, Indium Tin Oxide, Aluminum Zinc Oxide and other metallic oxides. Pattern of the first sensing circuit layer comprises but is not limited to the pattern mode shown in FIG. 3. For example, the first sensing circuit layer can consist of a plurality of mutually paralleled strip patterns.

Figure 4:
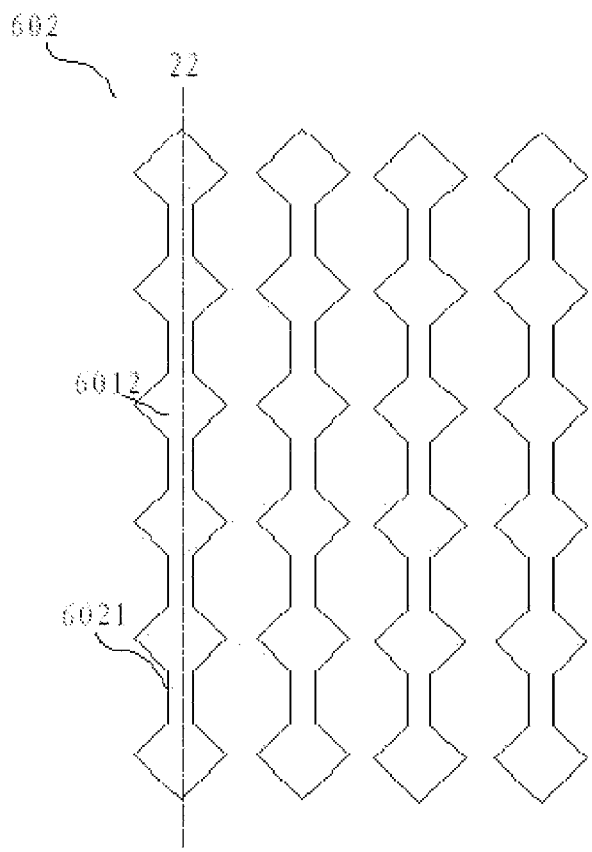
FIG. 4 is a schematic view of a second sensing circuit layer pattern.

FIG. 4 is a schematic view of a second sensing circuit layer pattern. As shown in FIG. 4, the second sensing circuit layer 602 is a second pattern conducting layer comprising a plurality of second touch electrode serials 6021 extended along a second direction 22, and each second touch electrode serial 6021 comprises a plurality of electrically connected second touch electrodes 6012. The second sensing circuit layer 602 can be a transparent conducting layer, wherein material of the transparent conducting layer can be selected from Indium Zinc Oxide, Gallium-doped Zinc Oxide, Aluminum-doped Zinc Oxide, Fluorine Tin Oxide, Antimony-doped Tin Oxide, Indium Tin Oxide, Aluminum Zinc Oxide and other metallic oxides. Pattern of the second sensing circuit layer comprises but is not limited to the pattern mode shown in FIG. 4. For example, the second sensing circuit layer can consist of a plurality of mutually paralleled strip patterns. The first direction 21 and the second direction 22 can be X-axis and Y-axis of a rectangular coordinate system, or Taxis and N-axis of a tangent/normal coordinates.

Referring to FIG. 2 again, an air layer 603 is between the first sensing circuit layer 601 and the second sensing circuit layer 602, wherein the air layer 603 electrically insulates the first sensing circuit layer 601 and the second sensing circuit layer 602, and also has a function of insulation, so it omits a conventional manufacturing process of disposing an insulation layer between the first sensing circuit layer 601 and the second sensing circuit layer 602, which simplifies the manufacturing process and reduces cost of production. Furthermore, the distance of between the first sensing circuit layer 601 and the second sensing circuit layer 602 is more 2 μm, so that space distance between the two is more than thickness of insulation layer disposed conventionally to reduce the influence of coupling capacitance between the two during touch detection, thereby improving accuracy of touch detection. Moreover, given the sensitivity and accuracy of the touch detection, it is better to make the thickness of the air layer 603 defined to a certain distance of 5 μm~100 μm.

When a conductive object (such as a finger or a stylus) touches or closely approaches the first surface 201 of the upper substrate 20, the first sensing circuit layer 601 and the second sensing circuit layer 602 generate sensing signals and a touch detection circuit will determine horizontal and vertical coordinates of the touch based on change of the sensing signals before and after the touch.

Referring to FIG. 2 again, the OLED display layer 90 is disposed on the first surface 301 of the lower substrate 30. The OLED display layer 90 comprises an active element array 80 and an organic light-emitting layer 40; the organic light-emitting layer 40 comprises an counter electrode 401, a pixel electrode 403, and an intermediate layer 402 between the counter electrode 401 and the pixel electrode 403. The active element array 80 is disposed on the first surface 301 of the lower substrate 30; the active element array 80 comprises a plurality of active elements (not shown), and each active element is electrically connected to the pixel electrode 403 disposed on it.

The pixel electrode 403 and counter electrode 401 serve as cathode electrode and anode electrode of the OLED display layer respectively. If the pixel electrode 403 is an anode electrode, the counter electrode 401 will be cathode electrode; but the order can be changed, wherein if the pixel electrode 403 is a cathode electrode, the counter electrode 401 will be anode electrode.

If the pixel electrode 403 is anode electrode, the pixel electrode 403 can be formed by a transparent electrode. The transparent conductive electrode can be formed by IZO, ITO, ZnO, $In_2O_3$, $Ti_2O_3$, $Ti_3O_5$ or other metallic oxides; wherein if the pixel electrode 403 is cathode electrode, the pixel electrode 403 can be formed by a metal electrode and the metal electrode can be formed by Ni, Ti, Zn, Cr, Mg, Al, In or other metals.

Similarly, if the counter electrode 401 is an anode electrode, the counter electrode 401 can be formed by a transparent electrode and the transparent conductive electrode can be formed by IZO, ITO, ZnO, $In_2O_3$, $Ti_2O_3$, $Ti_3O_5$ or other metallic oxides, and if the counter electrode 401 is a cathode electrode, the counter electrode 401 can be formed by a metal electrode and the metal electrode can be formed by Ni, Ti, Zn, Cr, Mg, Al, In or other metals.

An intermediate layer 402 is formed between the pixel electrode 403 and the counter electrode 401, and can be formed by an organic material. The intermediate layer 402 can comprise stacking structures of a hole injection layer (HIL), a hole transport layer (HTL), an electron transport layer (ETL), an electron injection layer (EIL) and so on. Besides, different stacking structures can be formed by collocating with different material layers.

A protection layer 70 covers surface of the counter electrode 401, wherein the protection layer 70 is mainly made of an insulation material which can be polyimide (PI), polymethyl methacrylate (PMMA) or polysiloxane (POS). Function of the protection layer 70 is to electrically insulate the second sensing circuit layer 602 and the counter electrode 401 and to protect the conductive material of the counter electrode 401 from being corroded by Oxygen and water vapor.

In order to better avoid the touch display device 2 from being corroded by Oxygen and water vapor, the touch display device 2 further comprises a sealing glue layer 50. The sealing glue layer 50 glues the upper substrate 20 and the lower substrate 30 together so that the OLED display layer 90 and the touch module 60 are formed inside the room between the upper substrate 20 and the lower substrate 30.

The Second Embodiment

Figure 5:
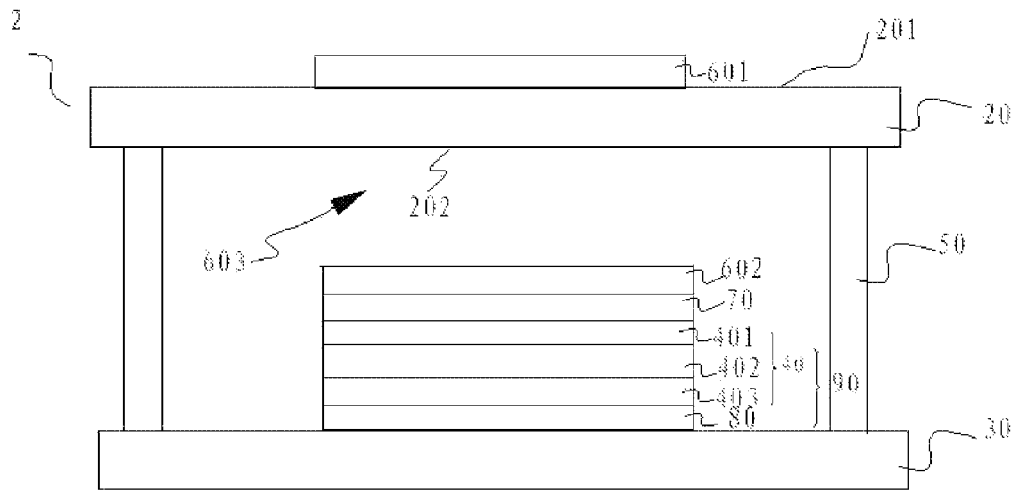
FIG. 5 is a schematic view of a touch display device in accordance with the second embodiment of the present invention.

FIG. 5 is a schematic view of a touch display device in accordance with a second embodiment of the present invention. The touch display device comprises: an upper substrate 20, a lower substrate 30, a protection layer 70, an OLED display layer 90 and a touch module 60. Components used in the present embodiment and the relative positions between the components are similar to the first embodiment; wherein the main difference lies in the position of the touch module 60 among other components. In the first embodiment, the air layer 603 is between the first sensing circuit layer 601 and the second sensing circuit layer 602, more specifically, the first sensing circuit layer 601 and the second sensing circuit layer 602 of the touch module 60 are located on the second surface 202 of the upper substrate 20 and above the OLED display layer 90 respectively and more particularly, the second sensing circuit layer 602 is disposed on a surface of the protection layer 70 that covers the OLED display layer 90. However, in the second embodiment, the upper substrate and the air layer are between the first sensing circuit layer 601 and the second sensing circuit layer 602, more specifically, the first sensing circuit layer 601 is disposed on the first surface 201 of the upper substrate 20 while the second sensing circuit layer 602 is still disposed on a surface of the protection layer 70. Other components of the present embodiment and the position relationship between the components have been described in detail in the first embodiment, so no more description is made hereby.

The Third Embodiment

Figure 6:
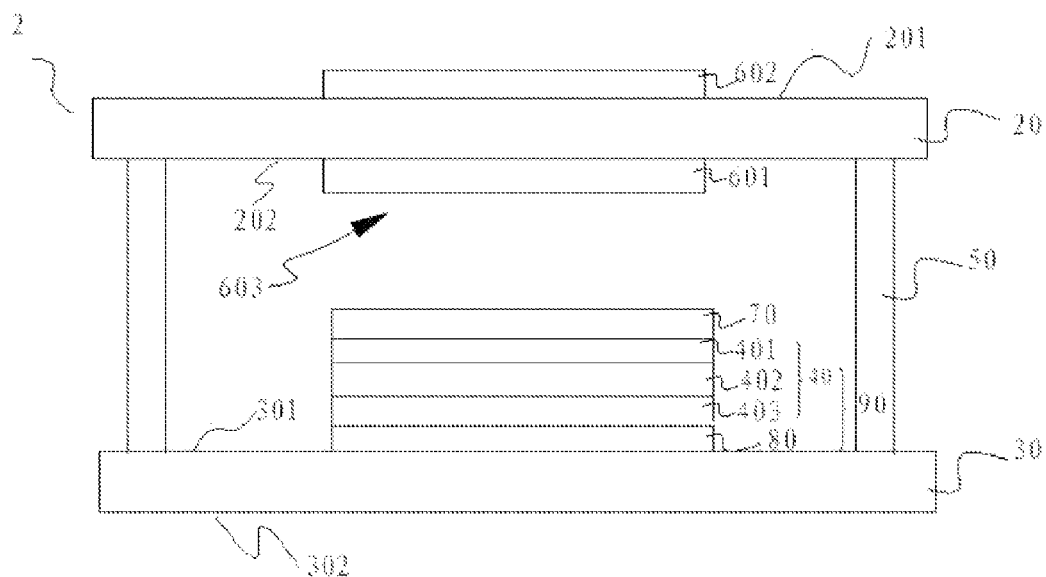
FIG. 6 is a schematic view of a touch display device in accordance with the third embodiment of the present invention.

FIG. 6 is a schematic view of a touch display device in accordance with the third embodiment of the present invention. Components used in the present embodiment and the relative positions between the components are similar to the first embodiment; the main difference lies in the position of the touch module 60 between other components, namely in the first embodiment, the air layer 603 is between the first sensing circuit layer 601 and the second sensing circuit layer 602, more specifically, the first sensing circuit layer 601 and the second sensing circuit layer 602 of the touch module 60 are disposed on the second surface 202 of the upper substrate 20 and on a surface of the protection layer 70 respectively. However, in the present embodiment, the upper substrate 20 is between the first sensing circuit layer 601 and the second sensing circuit layer 602, more specifically, the second sensing circuit layer 602 is disposed on the first surface 201 of the upper substrate 20 and the first sensing circuit layer 601 is disposed on the second surface 202 of the upper substrate 20. Other components of the present embodiment and the position relationship between the components have been described in detail in the first embodiment, so no more description is made hereby.

Figure 7:
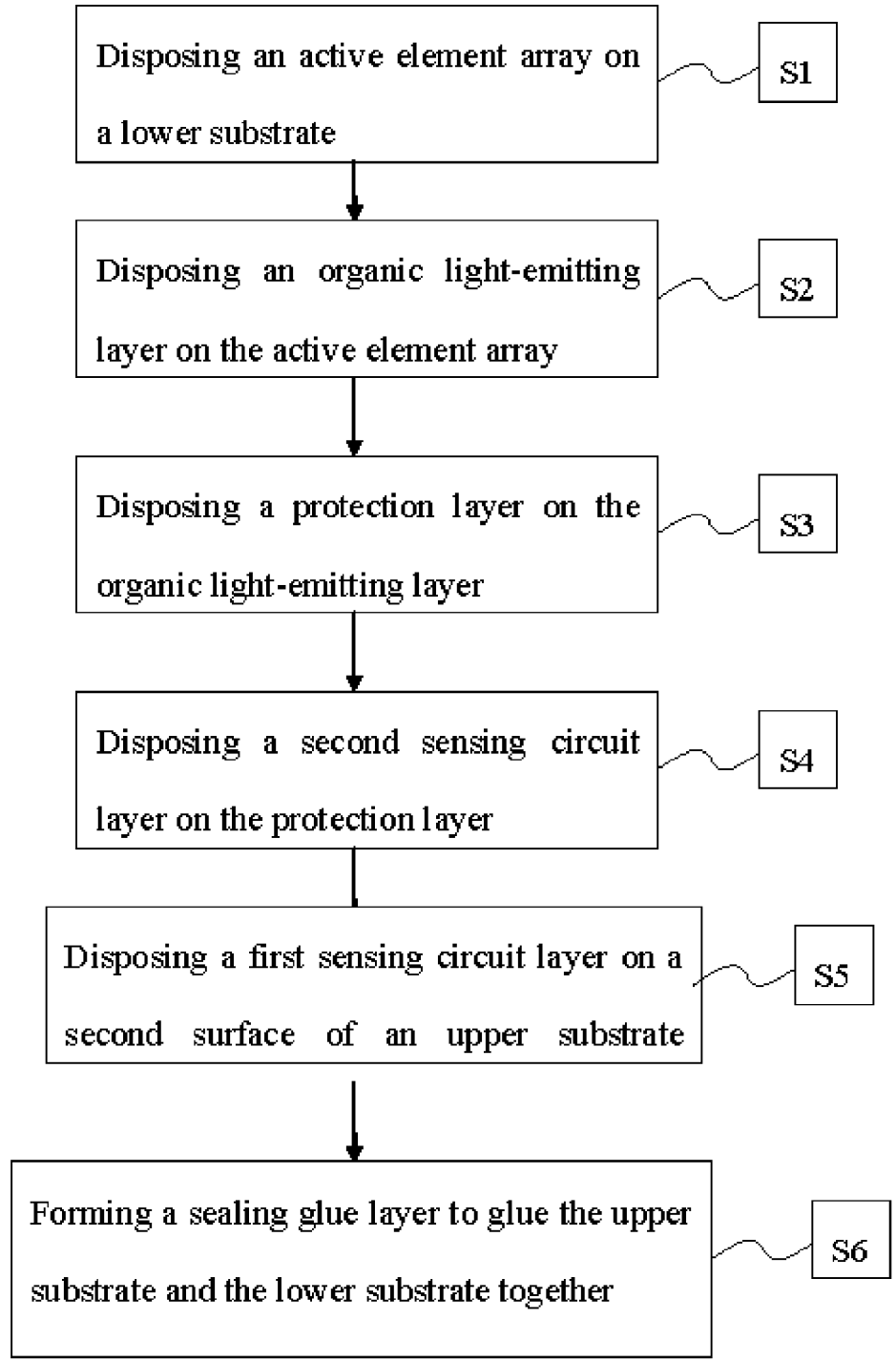
FIG. 7 is a flowchart of manufacturing method for a touch display device in accordance with the first embodiment of the present invention.

FIG. 7 is a flowchart of a manufacturing method for a touch display device in accordance with the first embodiment of the present invention. Referring to FIG. 2 simultaneously, the manufacturing method comprises disposing an OLED display layer 90 on a lower substrate 30; forming a touch module 60, wherein method of forming the touch module 60 comprises: disposing a first sensing circuit layer 601' on an upper substrate 20, the upper substrate 20 and the lower substrate 30 being disposed opposite to each other; and disposing a second sensing circuit layer 602 above the OLED display layer 90, namely disposing on a surface of a protection layer 70. The OLED display layer 90 comprises an active element array 80 and an organic light-emitting layer 40, wherein the light-emitting layer 40 comprises a counter electrode 401, a pixel electrode 403, and an intermediate layer 402 between the counter electrode 401 and the pixel electrode 403. Detailed steps of the manufacturing method are as follows.

Step S1: disposing an active element array 80 on the display region of a lower substrate 30.

Step S2: Disposing an organic light-emitting layer 40 on the active element array 80, method of forming the organic light-emitting layer 40 comprising forming a pixel electrode 403 that covers the active element array 80 and is electrically connected to the active element array 80, then forming an intermediate layer 402 on the pixel electrode 403, and finally forming a counter electrode 401 on the intermediate layer 402.

Step S3: disposing a protection layer 70 on the organic light-emitting layer 40, covering the counter electrode 401 of the organic light-emitting layer 40.

Step S4: disposing a second sensing circuit layer 602 on the protection layer 70, the second sensing circuit layer 602 being made of a transparent conductive material, such as Indium Zinc Oxide, Gallium-doped Zinc Oxide, Aluminum-doped Zinc Oxide, Fluorine Tin Oxide, Antimony-doped Tin Oxide, Indium Tin Oxide or Aluminum Zinc Oxide, and formed by a manufacturing process such as screen printing or sputtering.

Step S5: disposing a first sensing circuit layer 601 on a second surface 202 of an upper substrate 20, the first sensing circuit layer 601 being made of a transparent conductive material, such as Indium Zinc Oxide, Gallium-doped Zinc Oxide, Aluminum-doped Zinc Oxide, fluorine Tin Oxide, Antimony-doped Tin Oxide, Indium Tin Oxide or Aluminum Zinc Oxide, and formed by a manufacturing process such as screen printing or sputtering.

Step S6: forming a sealing glue layer to glue the upper substrate 20 and the lower substrate 30 together so that the touch module 60 and the OLED display layer 90 are encapsulated inside the space formed between the two substrates.

The touch display device made by the above method can effectively reduce interference between the electrode layers and improve accuracy for detection of touch location.

Besides, the manufacturing method for a touch display device in the second embodiment is similar to the manufacturing method in the first embodiment; the difference lies in that in the second embodiment, the first sensing circuit layer 601 is formed on the first surface 201 of the upper substrate 20.

Similarly, the manufacturing method for a touch display device in the third embodiment is similar to the manufacturing method in the first embodiment; the difference lies in that in the third embodiment, the second sensing circuit layer 602 is formed on the first surface 201 of the upper substrate 20, so no more description is made hereby.

In conclusion, touch display device of the present invention adopts the design of increasing space distance between the first sensing circuit layer and the second sensing circuit layer to reduce interference in touch detection signals caused by coupling capacitance generated between them, and then improving accuracy for detection of touch location.

Although the present invention has been described with reference to the embodiments thereof and best modes for carrying out the present invention, it is apparent to those skilled in the art that a variety of modifications and changes may be made without departing from the scope of the present invention, which is intended to be defined by the appended claims.

What is claimed is:

1. A touch display device, comprising:
   an OLED display layer disposed on a lower substrate and comprising a counter electrode;
   an upper substrate;
   an air layer formed between the upper substrate and the lower substrate;
   a sealing glue layer formed between the upper substrate and the lower substrate;
   a capacitive touch module disposed above the OLED display layer, wherein the capacitive touch module comprises:
      a first sensing circuit layer, wherein the first sensing circuit layer is a first pattern conducting layer comprising a plurality of first touch electrode serials extending in a first direction, wherein each of the plurality of first touch electrode serials comprises a plurality of electrically connected first touch electrodes, and wherein the first sensing circuit layer is disposed outside a space formed by the upper substrate, the lower substrate and the sealing glue layer; and
      a second sensing circuit layer, wherein the second sensing circuit layer is a second pattern conducting layer comprising a plurality of second touch electrode serials extending in a second direction, wherein each of the plurality of the second touch electrode serials comprises a plurality of electrically connected second touch electrodes, wherein the second sensing circuit layer and the OLED display layer are disposed inside the space formed by the upper substrate, the lower substrate and the sealing glue layer, wherein the first sensing circuit layer and the second sensing circuit layer are spaced apart; and
   a protection layer disposed on the OLED display layer and in direct contact with the counter electrode, wherein the second sensing circuit layer is in direct contact with the protection layer, and wherein each of the protection layer and the second sensing circuit layer extends in a single plane.

2. The touch display device as claimed in claim 1, wherein the protection layer electrically insulates the second sensing circuit layer from the counter electrode.

3. The touch display device as claimed in claim 1, wherein the air layer is disposed between the first sensing circuit layer and the second sensing circuit layer and wherein a thickness of the air layer between the first sensing circuit layer and the second sensing circuit layer ranges from 5 μm to 100 μm.

4. The touch display device as claimed in claim 1, wherein the air layer and the upper substrate are between the first sensing circuit layer and the second sensing circuit layer, wherein the upper substrate comprises a first surface that faces away from the OLED display layer and a second surface that faces the OLED display layer, and wherein the first sensing circuit layer is disposed on the first surface and the second sensing circuit layer is disposed above the OLED display layer.

5. The touch display device as claimed in claim 1, wherein the first sensing circuit layer and the second sensing circuit layer are spaced apart by a distance of more than 2 μm.

6. The touch display device as claimed in claim 1, wherein the first direction and the second direction are different directions.

7. The touch display device as claimed in claim 1, wherein the OLED display layer comprises:
   an active element array disposed on the lower substrate; and
   an organic light-emitting layer disposed on the active element array, wherein the organic light-emitting layer comprises the counter electrode, a pixel electrode and an intermediate layer.

8. A touch display device, comprising:
   an OLED display layer disposed on a lower substrate and comprising a counter electrode;
   a protection layer disposed on the OLED display layer and in direct contact with the counter electrode;
   an upper substrate, wherein the protection layer is disposed between the lower substrate and the upper substrate;
   a first sensing circuit layer disposed on a surface of the upper substrate that faces away from the protection layer; and
   a second sensing circuit layer in direct contact with the protection layer, wherein the first sensing circuit layer and the second sensing circuit layer are spaced apart by an air layer and the upper substrate, wherein the protection layer electrically insulates the second sensing circuit layer from the counter electrode, and wherein each of the protection layer and the second sensing circuit layer extends in a single plane.

9. The touch display device as claimed in claim 8, wherein the air layer between the first sensing circuit layer and the second sensing circuit layer has a thickness ranging from 5 μm to 100 μm.

10. The touch display device as claimed in claim 8, further comprising a sealing glue layer formed between the upper substrate and the lower substrate, wherein the OLED display layer is encapsulated inside a space formed by the upper substrate, the lower substrate and the sealing glue layer, and wherein the first sensing circuit layer is outside the space formed by the upper substrate, the lower substrate and the sealing glue layer.

11. The touch display device as claimed in claim 8, wherein the first sensing circuit layer is a first pattern conducting layer comprising a plurality of first touch electrode serials extending in a first direction, wherein each of the plurality of first touch electrode serials comprises a plurality of electrically connected first touch electrodes, wherein the second sensing circuit layer is a second pattern conducting layer comprising a plurality of second touch electrode serials extending in a second direction, wherein each of the plurality of the second touch electrode serials comprises a plurality of electrically connected second touch electrodes, and wherein the first direction and the second direction are different directions.

12. A touch display device, comprising:
a lower substrate;
an OLED display layer disposed on the lower substrate and comprising a counter electrode;
an upper substrate opposite the OLED display layer relative to the lower substrate;
an air layer formed between the upper substrate and the lower substrate;
a sealing glue layer formed between the upper substrate and the lower substrate;
a capacitive touch module disposed above the OLED display layer, wherein the capacitive touch module comprises:
a first sensing circuit layer disposed outside a space formed by the upper substrate, the lower substrate and the sealing glue layer, wherein the first sensing circuit layer is a first pattern conducting layer comprising a plurality of first touch electrode serials extending in a first direction, and wherein each of the plurality of first touch electrode serials comprises a plurality of electrically connected first touch electrodes; and
a second sensing circuit layer disposed inside the space formed by the upper substrate, the lower substrate and the sealing glue layer, wherein the second sensing circuit layer is a second pattern conducting layer comprising a plurality of second touch electrode serials extending in a second direction, and wherein each of the plurality of the second touch electrode serials comprises a plurality of electrically connected second touch electrodes; and
a protection layer disposed on the OLED display layer and in direct contact with the counter electrode, wherein the second sensing circuit layer is in direct contact with the protection layer, and wherein each of the protection layer and the second sensing circuit layer extends in a single plane.

13. The touch display device as claimed in claim 12, wherein the air layer and the upper substrate are between the first sensing circuit layer and the second sensing circuit layer, wherein the upper substrate comprises a first surface that faces away from the OLED display layer and a second surface that faces the OLED display layer, and wherein the first sensing circuit layer is disposed on the first surface and the second sensing circuit layer is disposed above the OLED display layer.

14. The touch display device as claimed in claim 13, wherein the protection layer electrically insulates the second sensing circuit layer from the counter electrode.

15. The touch display device as claimed in claim 12, wherein the OLED display layer is encapsulated inside the space formed by the upper substrate, the lower substrate and the sealing glue layer.

16. The touch display device as claimed in claim 12, wherein the first direction and the second direction are different directions.

17. The touch display device as claimed in claim 12, wherein the first sensing circuit layer and the second sensing circuit layer are spaced apart by a distance of more than 2 µm.

* * * * *